United States Patent [19]

Tanaka et al.

[11] Patent Number: 5,422,337
[45] Date of Patent: Jun. 6, 1995

[54] STEP-EDGED GRAIN BOUNDARY JOSEPHSON JUNCTION WITH 5 TO 30 DEGREES INCLINED ANGLE

[75] Inventors: Saburo Tanaka; Takashi Matsuura; Hideo Itozaki, all of Hyogo, Japan

[73] Assignee: Sumitomo Electric Industries, Osaka, Japan

[21] Appl. No.: 68,189

[22] Filed: May 28, 1993

[30] Foreign Application Priority Data

May 29, 1992 [JP] Japan .................. 4-164150

[51] Int. Cl.$^6$ .............. H01L 39/22; H01L 39/00; H01L 27/00
[52] U.S. Cl. .................. 505/190; 505/234; 505/239; 505/329; 505/701; 505/702; 257/33; 257/34; 257/31
[58] Field of Search ............ 257/31, 32, 33, 34, 257/35, 36; 505/190, 234, 239, 329, 700, 701, 702

[56] References Cited

U.S. PATENT DOCUMENTS 5,077,266 12/1991 Takagi et al. .................. 505/1

FOREIGN PATENT DOCUMENTS 0496259 7/1992 European Pat. Off. .
4212028 11/1992 Germany .
64-10678 1/1989 Japan .................. 257/34
1241874 9/1989 Japan .................. 257/34

OTHER PUBLICATIONS

G. Friedl et al., "Transport Properties of epitaxial YBa2CU3Ox films at step edges, Applied Physics Letters:" 50 vol. 59, No. 21, 18 Nov. 1991, New York US pp. 2751-2753.
J. S. Martens et al., "Tl-Ca-Ba-Cu-O step-edge Josephson junctions", Applied Physics Letters vol. 60, No. 9, 2 Mar. 1992, New York US, pp. 1141-1143.
R. B. Laibowitz et al., "All High $T_c$ edge junctions and SQUIDs", Applied Physics Letters, vol. 56 No. 7, 12 Feb. 1990, New York US pp. 686-688.
K. P. Daly, "Substrate step-edge YBA2Cu3O7", Applied Physics Letters, 4 Feb. 1991, New York US, pp. 543-545.
Jia et al., "Microstructure of Epitaxial YBa2Cu3O7 Films on Step-Edges SrTiO3 Substrate", Physica C, vol. 175, 1991, pp. 545-554.
Luine et al., "Characteristics of High Performance YB$_{a2}$Cu3O7 Step-Edge Junctions", Appl. Phys. Lett. vol. 61, No. 9, Aug. 31, 1992, pp. 1128-1130.

*Primary Examiner*—William D. Larkins
*Assistant Examiner*—Alice W. Tang
*Attorney, Agent, or Firm*—Foley & Lardner

[57] ABSTRACT

A Josephson junction device comprising a single crystalline substrate including a principal surface having two horizontal planes and a smooth slope between the two horizontal planes, and an oxide superconductor thin film formed on the principal surface of the substrate. The oxide superconductor thin film includes a first and a second superconducting portions of a single crystalline oxide superconductor respectively positioned on the two horizontal planes of the substrate, a junction portion of a single crystalline oxide superconductor having a different crystal orientation from the two superconducting portions positioned on the slope of the substrate and two grain boundaries between each of the two superconducting portions and the junction portion. The grain boundaries constitutes one weak link of the Josephson junction.

9 Claims, 2 Drawing Sheets

STEP-EDGED GRAIN BOUNDARY JOSEPHSON JUNCTION WITH 5 TO 30 DEGREES INCLINED ANGLE

BACKGROUND OF THE INVENTION

1. Field of the Invention

The present invention relates to a Josephson junction device formed of oxide superconductor, and more specifically to a Josephson junction device of an oxide superconductor, of which the weak link of the Josephson junction is constituted of grain boundaries of oxide superconductor.

2. Description of Related Art

A Josephson junction device which is one of superconducting devices can be realized in various structures. Among the various structures, the most preferable structure in practice is a stacked junction realized by a thin non-superconductor layer sandwiched between a pair of superconductors. However, a point contact type junction, a Dayem bridge type junction and a variable thickness bridge type junction which are composed of a pair of superconductor regions which are weakly linked to each other also exhibit Josephson effect. In general, these Josephson junctions have fine structures in which the superconductor and/or non-superconductor are composed of thin films.

In order to realize a stacked type junction by using an oxide superconductor, a first oxide superconductor thin film, a non-superconductor thin film and a second oxide superconductor thin film are stacked on a substrate in the named order.

In the above mentioned stacked type junction, an insulator MgO etc., a semiconductor Si etc., and a metal Au etc. are used for the non-superconductor layers so that each superconducting junction has different properties for each applications.

The thickness of the non-superconductor layer of the stacked type junction is determined by the coherence length of the superconductor. In general, the thickness of the non-superconductor layer of the stacked type junction must be within a few times of the coherence length of the superconductor. Since oxide superconductor materials have a very short coherence length, therefore, a thickness of a non-superconductor layer must be about a few nanometers.

However, the superconductor layers and the non-superconductor layer of the stacked type junction must be of high crystallinity for favorable junction properties, which are composed of single crystals or composed of polycrystals which are orientated in almost same direction. It is difficult to stack an extremely thin and high crystalline non-superconductor layer on an oxide superconductor layer. Additionally, it is very difficult to stack a high crystalline oxide superconductor layer on the non-superconductor layer stacked on an oxide superconductor layer. Though the stacked structure including a first oxide superconductor layer, a non-superconductor layer and a second oxide superconductor layer is realized, the interfaces between the oxide superconductor layers and the non-superconductor layer are not in good condition so that the stacked type junction does not function in good order.

In order to manufacture a point contact type junction, a Dayem bridge type junction and a variable thickness bridge type junction by using oxide superconductor, very fine processings which realize a weak link of a pair of superconductor are necessary. It is very difficult to conduct a fine processing with good repeatability.

The point contact type junction has been formed of two oxide superconductor thin films which are in contact with each other in a extremely small area which constitutes the weak link of the Josephson junction.

The Dayem bridge type junction has been formed of a constant thickness oxide superconductor thin film which is formed on a substrate and which is patterned in a plan view, so that a superconductor thin film region having a greatly narrow width is formed between a pair of superconductor thin film regions having a sufficient width. In other words, the pair of superconductor thin film regions having a sufficient width are coupled to each other by the superconductor thin film region having the greatly narrow width. Namely, a weak link of the Josephson junction in the superconductor thin film is formed at the greatly narrow width region.

On the other hand, the variable thickness bridge type junction has been formed of an oxide superconductor thin film of a sufficient thickness which is formed on a substrate and which is partially etched or thinned in a thickness direction, so that a thinned oxide superconductor thin film portion is formed between a pair of superconductor thin film portions having the sufficient thickness. In other words, the pair of superconductor thin film portions having the sufficient thickness are coupled to each other by the thinned oxide superconductor thin film portion. Accordingly, a weak link of the Josephson junction is formed at the reduced thickness portion of the oxide superconductor thin film.

As would be understood from the above, a characteristics of the Josephson device has a close relation to the contact area of the superconductor thin film in the point contact type Josephson device, the width of the superconductor thin film region having the extremely narrow width in the Dayem bridge type Josephson device, and to the thickness of the thinned oxide superconductor thin film portion in the variable thickness bridge type Josephson device, both of which form the weak link of the Josephson junction. Therefore, in order to obtain a desired characteristics with a good repeatability, a high precision on a sub-micron level of the processing such as the etching is required.

The Dayem bridge type Josephson device can be said to be more preferable than the variable thickness bridge type Josephson device, since the Dayem bridge type Josephson device has a relatively planer surface, which is preferred in a integrated circuit. However, in order to form the weak link in the Dayem bridge type Josephson device, it is required to pattern an oxide superconductor thin film having the thickness on the order of 0.5 $\mu$m to 1.0 $\mu$m into a width of not greater than 0.2 $\mu$m. However, it is very difficult to conduct this fine patterning with good repeatability.

On the other hand, in the variable thickness bridge type Josephson device, the very fine patterning is not required in order to form the weak link. However, it is very difficult to uniformly control the remaining thickness of the thinned portion forming the weak link. In addition, the variable thickness bridge type Josephson device cannot have a planer surface by nature. This is not preferable to the integrated circuit application.

Therefore, in the prior art, it is almost impossible to manufacture a superconducting device for example a dc SQUID (superconducting quantum interference device) which has plural homogeneous Josephson junctions utilizing an oxide superconductor.

SUMMARY OF THE INVENTION

Accordingly, it is an object of the present invention to provide a Josephson junction device composed of an oxide superconductor material including a weak link of the Josephson junction and an almost planar surface, which have overcome the above mentioned defects of the conventional ones.

Another object of the present invention is to provide a Josephson junction device composed of an oxide superconductor material including plural weak links of the Josephson junction which have homogeneous characteristics.

The above and other objects of the present invention are achieved in accordance with the present invention by a Josephson junction device comprising a single crystalline substrate including a principal surface having two horizontal planes and a smooth slope between the two horizontal planes, and an oxide superconductor thin film formed on the principal surface of the substrate, which includes a first and a second superconducting portions of a single crystalline oxide superconductor respectively positioned on the two horizontal planes of the substrate, a junction portion of a single crystalline oxide superconductor having a different crystal orientation from the two superconducting portions positioned on the slope of the substrate and two grain boundaries between each of the two superconducting portions and the junction portion, which constitutes one weak link of the Josephson junction.

In a prior art, there is known a Josephson junction device utilizing an oxide superconductor which includes a substrate having a step on a surface and an oxide superconductor thin film formed on the stepped surface of the substrate. This conventional Josephson junction device has a step on its upper surface. The step becomes one of obstacles for forming conductor wirings or a multi-layered structure.

The Josephson junction device in accordance with present invention has a substantially planar upper surface. Therefore, it become easy to form conductor wirings or to realize a multi-layered structure. This planar upper surface can be realized by the smooth slope of the substrate.

Preferably, the oxide superconductor thin film includes two junction portions, each of which includes the grain boundaries which constitute the weak link of the Josephson junction. In this case, it is preferable that the oxide superconductor thin film is formed in an rectangular ring shape which includes two junction portions each of which includes the grain boundaries which constitute the weak link of Josephson junction, so that the Josephson junction device constitutes a dc SQUID.

In a preferred embodiment, the slope inclines at an angle of 5° to 30°. If the gradient is smaller than 5°, the crystal orientation of the oxide superconductor of the junction portion does not change and no grain boundary is formed. If the gradient is larger than 30°, a step is formed on the upper surface of the oxide superconductor thin film so that it does not become planar. In addition, if the gradient is too large, the grain boundaries become unstable, so that the value of the critical current of the Josephson junction becomes unstable.

In the Josephson junction device in accordance with the present invention, the length of the slope of the substrate is determined by the difference of the heights of the horizontal planes of the principal surface of the substrate. The difference of the heights of the horizontal planes is preferably 100 to 500 nanometers. If the difference is smaller than 100 nanometers, the oxide superconductor of the junction portion does not have enough crystallinity so that the characteristics of the Josephson junction is spoiled. On the other hand, if the difference is larger than 500 nanometers, the grain boundaries become too far away from each other so that each of the weak links independently operates.

The preferable difference of the heights of the horizontal planes is relative to the thickness of the oxide superconductor thin film. In the Josephson junction device in accordance with the present invention, it is preferable that the oxide superconductor thin film has a thickness of 100 nanometers to 1 $\mu$m.

It is preferable that the two superconducting portions are formed of c-axis orientated oxide superconductor thin films. Since, the oxide superconductor has the largest critical current density in a direction perpendicular to the c-axis of the crystal. Therefore, if the superconducting portions are formed of c-axis orientated oxide superconductor thin films, larger current can flow through the Josephson junction device.

In the Josephson junction device in accordance with the present invention, the substrate is limited to an MgO substrate, since the crystal orientation of an oxide superconductor thin film deposited on the MgO substrate is sensitively affected by the condition of the deposition surface of the MgO substrate. If a portion of the deposition surface inclines, the crystal orientation of the oxide superconductor thin film is deviated on the portion corresponding to the gradient of the portion. The Josephson junction device in accordance with the present invention utilizes this property.

In one preferred embodiment, the junction portion of the oxide superconductor thin film has a narrower width than other portions. This narrow junction portion stables the Josephson effect generated at the junction portion. The narrow junction portion of the oxide superconductor thin film preferably has a width of 1.5 to 15 $\mu$m and a length of 5 to 50 $\mu$m.

In a preferred embodiment, the oxide superconductor is formed of high-$T_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

The above and oilier objects, features and advantages of the present invention will be apparent from the following description of preferred embodiments of the invention with reference to the accompanying drawings.

DESCRIPTION OF THE PREFERRED EMBODIMENTS

Embodiment 1

Figure 1:
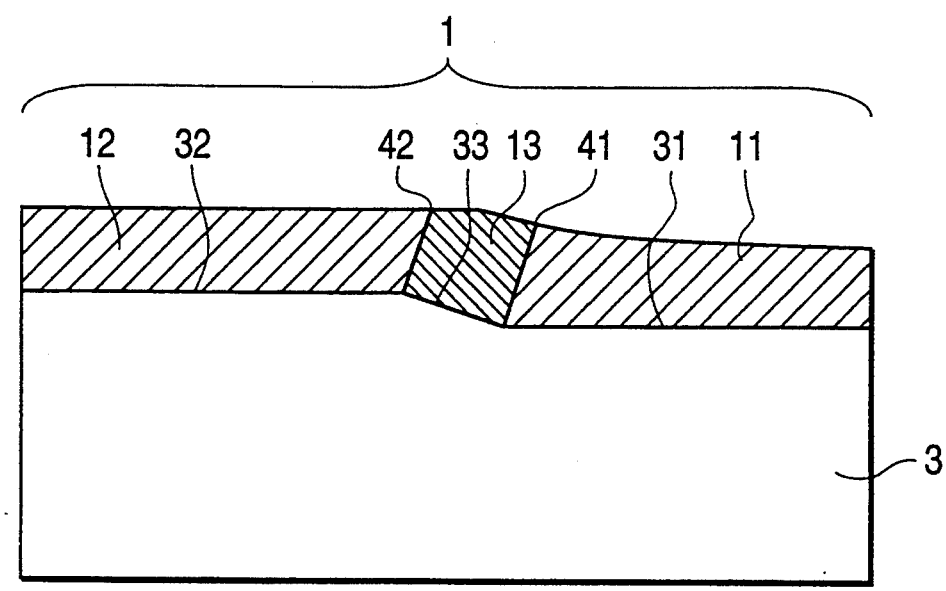
FIG. 1 is a diagrammatic sectional view of an embodiment of the Josephson junction device in accordance with the present invention.

Referring to FIG. 1, them is shown a diagrammatic sectional view of an embodiment of the Josephson junction device in accordance with the present invention. The Josephson junction device includes an MgO (100) single crystalline substrate 3 and a $Y_1Ba_2Cu_3O_{7-x}$ oxide superconductor thin film 1 formed on an upper surface of the substrate 3 having a thickness of 300 nanometers. The upper surface of the MgO (100) single crystalline substrate 3 has two horizontal planes 31 and 32 ((100) plane) having different heights, and a smooth slope 33 between the horizontal planes 31 and 32. The slope 33 inclines at an angle of 20° and the difference of the heights of the horizontal planes 31 and 32 is 200 nanometers. However, the upper surface of the $Y_1Ba_2Cu_3O_{7-x}$ oxide superconductor thin film 1 has a small swelling so that it can be taken as a plane.

The $Y_1Ba_2Cu_3O_{7-x}$ oxide superconductor thin film 1 has two superconducting portions 11 and 12, and a junction portion 13. The superconducting portions 11 and 12 are positioned on the horizontal planes 31 and 32 of the substrate 3, and the junction portion 13 is positioned on the slope 33 of the substrate 3. The superconducting portions 11 and 12 are constituted of c-axis orientated $Y_1Ba_2Cu_3O_{7-x}$ oxide superconductor thin films which have c-axes of crystals perpendicular to the horizontal planes 31 and 32. On the other hand, c-axes of $Y_1Ba_2Cu_3O_{7-x}$ oxide superconductor crystal of the junction portion 13 is perpendicular to the slope 33, so that the crystal orientation of the oxide superconductor of the junction portion 13 is different from those of the superconducting portions 11 and 12. Therefore, grain boundaries 41 and 42 are formed between the superconducting portion 11 and the junction portion 13, and between the superconducting portion 12 and the junction portion 13. Each of these grain boundaries 41 and 42 constitutes a weak link of the Josephson junction. However, the grain boundaries 41 and 42 are formed in close proximity to each other so that the weak links of the Josephson junction operate as one weak link of the Josephson junction.

Figure 2:
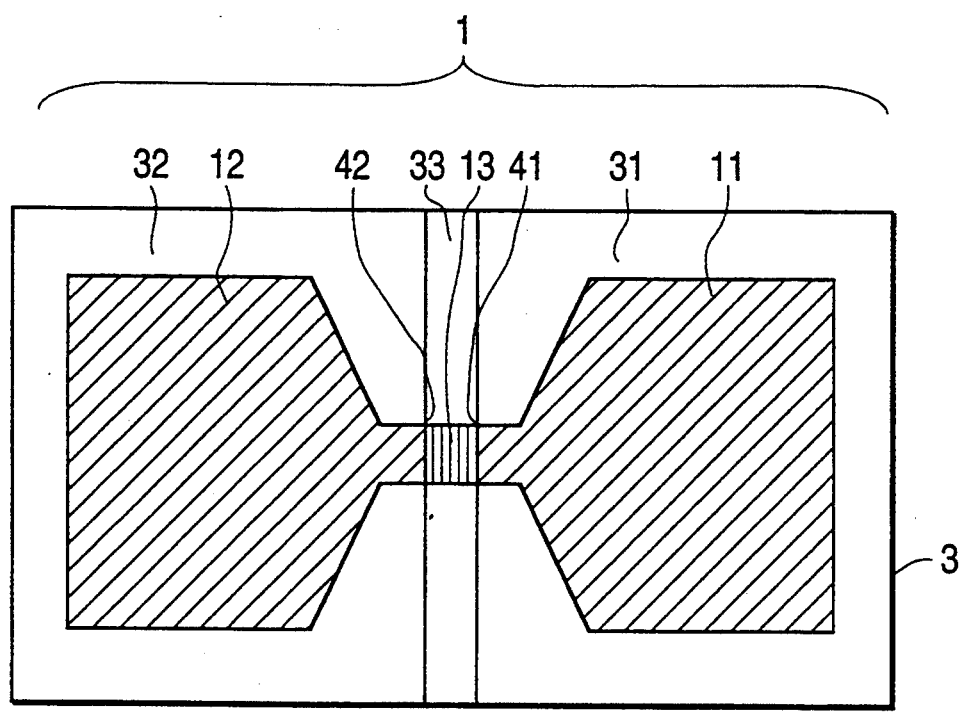
FIGS. 2 is a diagrammatic plane view of the Josephson junction device shown in FIG. 1.

FIG. 2 shows a plan view of the Josephson junction device shown in FIG. 1. As shown in FIG. 2, the superconducting portion 11 and 12 have the same pentagonal shape arranged symmetrically so as to form superconducting electrodes, and they are connected by the narrow junction portion 13. Only the junction portion 13 is positioned on the slope 33 of the substrate 3.

In the above Josephson junction device, the gradient of the slope 33 of the substrate 3 is preferably 5° to 30°. If the gradient is smaller than 5°, the crystal orientation of the oxide superconductor of the junction portion 13 does not change and no grain boundary is formed. If the gradient is larger than 30°, a step is formed on the upper surface of the oxide superconductor thin film 1 so that it does not become planar. In addition, if the gradient is too large, the grain boundaries 41 and 42 become unstable, so that the value of the critical current of the Josephson junction becomes unstable.

The difference of the heights of the horizontal planes 31 and 32 is preferably 100 to 500 nanometers. If the difference is smaller than 100 nanometers, the oxide superconductor of the junction portion 13 does not have enough crystallinity so that the characteristics of the Josephson junction is spoiled. On the other hand, if the difference is larger than 500 nanometers, the grain boundaries 41 and 42 become too far away from each other so that each of the weak links independently operates.

The preferable difference of the heights of the horizontal planes 31 and 32 is relative to the thickness of the oxide superconductor thin film 1. It is preferable that the oxide superconductor thin film 1 has a thickness of 100 nanometers to 1 $\mu m$.

The substrate 3 is limited to an MgO substrate, since the crystal orientation of an oxide superconductor thin film deposited on the MgO substrate is sensitively affected by the condition of the deposition surface of the MgO substrate. If a portion of the deposition surface inclines, the crystal orientation of the oxide superconductor thin film is deviated on the portion corresponding to the gradient of the portion. The Josephson junction device in accordance with the present invention utilizes this property.

The above Josephson junction device was manufactured by the following process.

At first, an MgO (100) substrate was etched by an ion-milling using Ar ions so as to form the slope 33 inclining at an angle of 20° on the principle (100) plane. A reactive ion etching could be used for this processing.

Thereafter, a $Y_1Ba_2Cu_3O_{7-x}$ oxide superconductor thin film 1 having a thickness of 300 nanometers was deposited on the substrate 3 by a sputtering process. The conditions of the sputtering process were as follows;

| Temperature of substrate | 650° C. |
|---|---|
| Sputtering gas | |
| Ar | 8 sccm |
| $O_2$ | 4 sccm |
| Pressure | $5 \times 10^{-2}$ Torr |

The $Y_1Ba_2Cu_3O_{7-x}$ oxide superconductor thin film 1 had two superconducting portions 11 and 12 on the horizontal planes 31 and 32 of the substrate 3, which were constituted of c-axis orientated $Y_1Ba_2Cu_3O_{7-x}$ oxide superconductor thin films having c-axes of crystals perpendicular to the horizontal planes 31 and 32, and one junction portion 13 on the slope 33, which was constituted of a $Y_1Ba_2Cu_3O_{7-x}$ oxide superconductor thin film having c-axes of its crystal perpendicular to the slope 33. Grain boundaries 41 and 42 were created at the interface between the portions 11 and 13 and between the portions 12 and 13.

Then, the $Y_1Ba_2Cu_3O_{7-x}$ oxide superconductor thin film 1 was etched so as to form the pentagonal superconducting electrodes of the superconducting portion 11 and 12, and the narrow bridge having a length 10 $\mu m$ and a width of 5 $\mu m$ of junction portion 13. Metal electrodes might be formed on the portions 1 1 and 12, if necessary. With this, the Josephson junction device in accordance with the present invention was completed.

A current-voltage characteristics of the above mentioned Josephson junction device was measured at a temperature of 85K. When a microwave of 15 GHz and of 0.2 mW was irradiated, clear Shapiro steps of was observed at multiple voltages of 31 $\mu V$, and therefore, it could be ascertained that the Josephson junction was realized in the device.

As explained above, the Josephson junction device in accordance with the present invention includes two superconducting electrodes of single-crystalline oxide superconductor on horizontal planes of a substrate, a junction portions of oxide superconductor on a slope of the substrate, which has a different crystal orientation, and a weak link of grain boundaries. The weak link of the Josephson junction device is formed of self-generated grain boundaries and there is no processing to form the weak link. Accordingly, the limitation in the fine processing technique required for manufacturing the Josephson junction device is relaxed.

Embodiment 2

Figure 3:
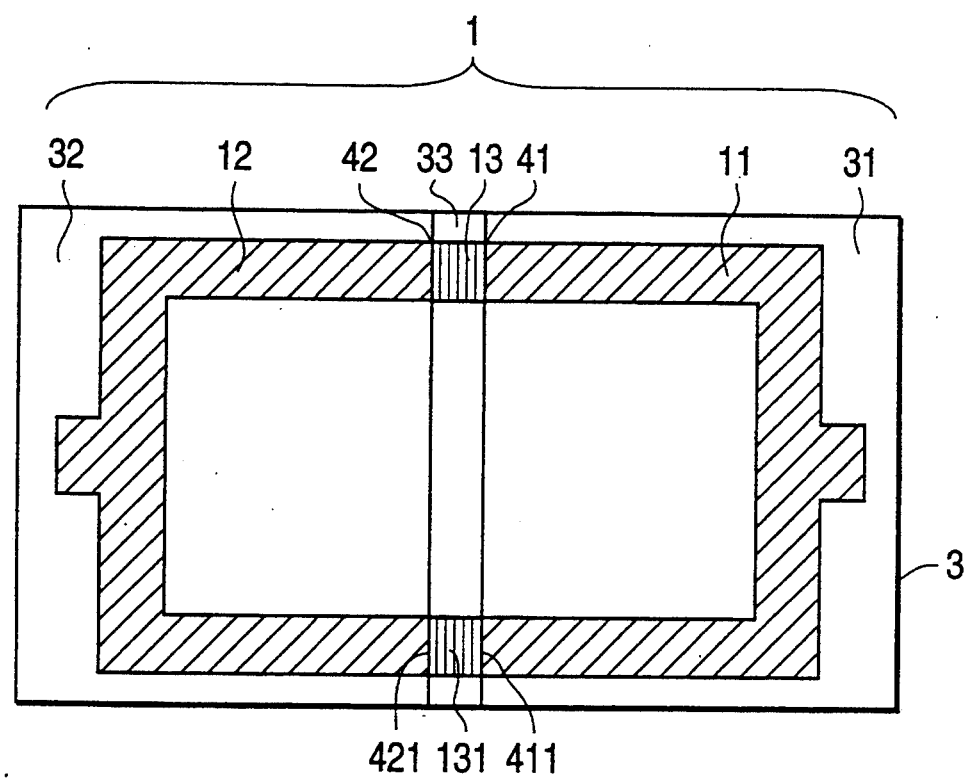
FIGS. 3 is a diagrammatic plane view of another embodiment of the Josephson junction device in accordance with the present invention.

Referring to FIG. 3, there is shown a diagrammatic plane view of another embodiment of the Josephson junction device in accordance with the present invention. The Josephson junction device shown in this embodiment is a dc SQUID, which has the same sectional structure as that of the Josephson junction device of Embodiment 1. As shown in FIG. 3, the de SQUID includes an MgO (100) substrate 3 which is similar to that of Embodiment 1 and a $Y_1Ba_2Cu_3O_{7-x}$ oxide superconductor thin film 1 which forms a rectangular ring shape including two superconducting portions 11 and 12 and two junction portions 13 and 131.

The superconducting portions 11 and 12 of the $Y_1Ba_2Cu_3O_{7-x}$ oxide superconductor thin film 1 are positioned on the horizontal planes 31 and 32 of the substrate 3 and formed of c-axis orientated oxide superconductor thin films. The junction portions 13 and 131 are positioned on the slope 33 and formed of $Y_1Ba_2Cu_3O_{7-x}$ oxide superconductor thin films of which c-axes are perpendicular to the slope 33.

Grain boundaries 41 and 42 are formed on the interfaces between the portions 11 and 13 and between the portions 12 and 13, and grain boundaries 411 and 421 are formed on the interfaces between the portions 11 and 131 and between the portions 12 and 131. Each of the grain boundaries 41, 42, 411 and 421 forms a weak link of the Josephson junction, however, the neighboring grain boundaries 41 and 42, and 411 and 421 are formed in close proximity to each other so that each of the neighboring weak links of the Josephson junction operates as one weak link of the Josephson junction. These two Josephson junctions has almost the same dimension so that their characteristics are homogeneous.

In order to manufacture the above dc SQUID, a rectangular ring shaped $Y_1Ba_2Cu_3O_{7-x}$ oxide superconductor thin film 1 having a thickness of 300 nanometers is deposited on the MgO (100) substrate 3 which has a slope 33 on its surface by using a patterned silicone plate as a mask.

As explained above, the dc SQUID in accordance with the present invention has two weak links of the Josephson junction which are constituted of the grain boundaries. Therefore, it become easy to form weak links of the Josephson junction of which properties are linear up. Accordingly, it is easy to manufacture the dc SQUID with good repeatability, and the manufactured dc SQUID has a stable performance.

In the above mentioned embodiments, the oxide superconductor thin film can be formed of not only the Y-Ba-Cu-O compound oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A Josephson junction device comprising a MgO single crystalline substrate including a principal surface having two horizontal planes and a slope inclined at an angle of 5° to 30° between the two horizontal planes, and an oxide superconductor thin film formed on the principal surface of the substrate, which includes a first and a second superconducting portions of a first single crystalline oxide superconductor and a second single crystalline oxide superconductor respectively positioned on the two horizontal planes of the substrate, a junction portion of a single crystalline oxide superconductor having a different crystal orientation from the first and second superconducting portions positioned on the slope of the substrate and two grain boundaries between each of the first and the second superconducting portions and the junction portion, which constitutes the weak link of the Josephson.

2. A Josephson junction device as claimed in claim 1, wherein the oxide superconductor thin film includes two junction portions, each of which includes the grain boundaries which constitute the weak link of the Josephson junction.

3. A Josephson junction device as claimed in claim 2, wherein the oxide superconductor thin film is formed in a rectangular ring shape which includes the two junction portions each of which includes the grain boundaries which constitute the weak link of Josephson junction, so that the Josephson junction device constitutes a dc SQUID.

4. A Josephson junction device as claimed in claim 1, wherein the difference of heights of the horizontal planes of the principal surface of the substrate is 100 to 500 nanometers.

5. A Josephson junction device as claimed in claim 1, wherein the oxide superconductor thin film is formed of c-axis oriented oxide superconductor thin film.

6. A Josephson junction device as claimed in claim 1, wherein the junction portion of the oxide superconductor thin film has a narrower width than the first and second superconducting portions.

7. A. Josephson junction device claimed in claim 6 wherein the narrow junction portion of the oxide superconductor thin film has a width of 1.5 to 15 μm and a length of 5 to 50 μm.

8. A Josephson junction device claimed in claim 1 wherein the oxide superconductor thin film is formed of a high-$T_c$ (high critical temperature) oxide superconductor, particularly, formed of a high-$T_c$ copper-oxide type compound oxide superconductor.

9. A Josephson junction device claimed in claim 8 wherein the oxide superconductor thin film is formed of an oxide superconductor material selected from the group consisting of a Y-Ba-Cu-O type compound oxide superconductor material, a Bi-Sr-Ca-Cu-O type compound oxide superconductor material, and a Tl-Ba-Ca-Cu-O type compound oxide superconductor material.

* * * * *